US009733286B2

(12) United States Patent
Chen et al.

(10) Patent No.: US 9,733,286 B2
(45) Date of Patent: Aug. 15, 2017

(54) METHOD FOR IDENTIFYING ELECTRIC APPLIANCE AND APPARATUS AND SYSTEM THEREOF

(71) Applicant: Industrial Technology Research Institute, Hsinchu (TW)

(72) Inventors: Hung-Yuan Chen, Hsinchu County (TW); Chien-Liang Lai, Hsinchu County (TW); Lun-Chia Kuo, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 940 days.

(21) Appl. No.: 14/082,205

(22) Filed: Nov. 18, 2013

(65) Prior Publication Data

US 2015/0039253 A1 Feb. 5, 2015

(30) Foreign Application Priority Data

Jul. 30, 2013 (TW) .............................. 102127311 A

(51) Int. Cl.
*G01R 21/133* (2006.01)
*G06Q 50/06* (2012.01)

(52) U.S. Cl.
CPC .......... *G01R 21/133* (2013.01); *G06Q 50/06* (2013.01)

(58) Field of Classification Search
CPC .................................................. G01R 21/133
USPC ........................................................ 702/60
See application file for complete search history.

(56) References Cited

U.S. PATENT DOCUMENTS

| 4,858,141 A | 8/1989 | Hart et al. |
| 4,890,002 A | 12/1989 | Schornack |
| 5,006,785 A | 4/1991 | Revus et al. |
| 5,184,189 A | 2/1993 | Hawsey et al. |

(Continued)

FOREIGN PATENT DOCUMENTS

| CA | 2086469 | 7/1993 |
| CN | 1006664 | 1/1987 |

(Continued)

OTHER PUBLICATIONS

Liang et al., "Load Signature Study—Part II: Disaggregation Framework, Simulation, and Applications," IEEE Transactions on Power Delivery 25 (2), Apr. 2010, pp. 561-569.

(Continued)

*Primary Examiner* — Ricky Ngon
(74) *Attorney, Agent, or Firm* — Jianq Chyun IP Office

(57) ABSTRACT

A method for identifying an electric appliance and an apparatus and a system thereof are provided. The method includes the following steps: respectively collecting a first power event on a first phase power and a second power event on a second phase power; when the first power event and/or the second power event are collected, determining whether the first power event and the second power event substantially occur at the same time; if not, identifying an unknown electric appliance as a first type electric appliance; and if yes, determining whether the first power event and the second power event are substantially the same, wherein if yes, identifying the unknown electric appliance as a second type electric appliance, and if no, identifying the unknown electric appliance as the first type electric appliance.

21 Claims, 8 Drawing Sheets

(56) References Cited

U.S. PATENT DOCUMENTS

| | | | |
|---|---|---|---|
| 5,483,153 A | 1/1996 | Leeb et al. | |
| 5,670,858 A | 9/1997 | Heath | |
| 6,380,868 B1 | 4/2002 | Hilliard et al. | |
| 7,340,353 B2 | 3/2008 | Gysling et al. | |
| 7,460,930 B1 | 12/2008 | Howell et al. | |
| 7,930,118 B2 | 4/2011 | Vinden et al. | |
| 8,094,034 B2 | 1/2012 | Patel et al. | |
| 8,209,062 B2 * | 6/2012 | Andrews | G01D 4/004 700/291 |
| 9,020,769 B2 * | 4/2015 | Rada | G01D 4/00 702/176 |
| 2002/0063866 A1 | 5/2002 | Kersey et al. | |
| 2005/0046821 A1 | 3/2005 | Hanson et al. | |
| 2007/0040516 A1 | 2/2007 | Chen | |
| 2007/0206521 A1 | 9/2007 | Osaje | |
| 2011/0302201 A1 * | 12/2011 | Ogaz | G06Q 30/02 707/769 |
| 2011/0307200 A1 | 12/2011 | Hsu et al. | |
| 2012/0197560 A1 * | 8/2012 | Kuhns | G01R 22/10 702/60 |
| 2013/0110621 A1 * | 5/2013 | Gupta | G01R 31/34 705/14.52 |
| 2013/0132008 A1 * | 5/2013 | Borean | G01D 4/00 702/60 |
| 2013/0187665 A1 * | 7/2013 | Rietman | G01R 19/2513 324/603 |

FOREIGN PATENT DOCUMENTS

| | | |
|---|---|---|
| CN | 1981198 | 6/2007 |
| CN | 101226168 | 7/2008 |
| CN | 101282040 | 10/2008 |
| CN | 101292406 | 10/2008 |
| CN | 101567559 | 10/2009 |
| CN | 201336584 | 10/2009 |
| CN | 101688897 | 3/2010 |
| CN | 101697429 | 4/2010 |
| CN | 101776740 | 7/2010 |
| CN | 101930028 | 12/2010 |
| CN | 102014523 | 4/2011 |
| CN | 102025399 | 4/2011 |
| CN | 102118015 | 7/2011 |
| CN | 102224425 | 10/2011 |
| CN | 102412104 | 4/2012 |
| CN | 102539969 | 7/2012 |
| CN | 102579008 | 7/2012 |
| CN | 102818853 | 12/2012 |
| CN | 102822639 | 12/2012 |
| EP | 436374 | 7/1991 |
| EP | 1296147 | 7/2007 |
| EP | 1316132 | 1/2009 |
| EP | 1337809 | 5/2010 |
| GB | 2475172 | 5/2011 |
| JP | H11-166855 | 6/1999 |
| JP | 2002152971 | 5/2002 |
| JP | 2004038765 | 2/2004 |
| JP | 3602825 | 12/2004 |
| JP | 2004340852 | 12/2004 |
| JP | 2007028813 | 2/2007 |
| JP | 4257057 | 4/2009 |
| JP | 2010078460 | 4/2010 |
| JP | 2011238921 | 11/2011 |
| TW | 201104595 | 2/2011 |
| TW | 201116836 | 5/2011 |
| TW | 201118384 | 6/2011 |
| TW | 201118385 | 6/2011 |
| TW | 201203770 | 1/2012 |
| TW | 201304341 | 1/2013 |
| WO | 8300922 | 3/1983 |
| WO | 9417586 | 8/1994 |
| WO | 9912253 | 3/1999 |
| WO | 2007024765 | 3/2007 |

OTHER PUBLICATIONS

Dong et al, "An Event Window Based Load Monitoring Technique for Smart Meters," IEEE Transactions on Smart Grid 3 (2), Jun. 2012, pp. 787-796.

Ruzzelli et al., "Real-time Recognition and Profiling of Appliances through a Single Electricity Sensor," 7th Annual IEEE Communications Society Conference on Sensor Mesh and Ad Hoc Communications and Networks (SECON), Jun. 21-25, 2010, pp. 1-9.

Marchiori et al., "Circuit-Level Load Monitoring for Household Energy Management," IEEE Pervasive Computing, Jan.-Mar. 2011, pp. 40-48.

Wang et al., "Residential Appliances Identification and Monitoring by a Nonintrusive Method," IEEE Transactions on Smart Grid 3 (1), Mar. 2012, pp. 80-92.

Liang et al., "Load Signature Study—Part I: Basic Concept, Structure, and Methodology," IEEE Transactions on Power Delivery 25 (2), Apr. 2010, pp. 551-560.

Shaw et al., "Nonintrusive Load Monitoring and Diagnostics in Power Systems," IEEE Transactions on Instrumentaion and Measurement 57 (7), Jul. 2008, pp. 1445-1454.

"Office Action of Taiwan Counterpart Application", issued on Jul. 24, 2015, p. 1-p. 7, in which the listed reference was cited.

"Office Action of Japan Counterpart Application", issued on Dec. 9, 2014, p. 1-p. 3, in which the listed references were cited.

* cited by examiner

|  | First Power | Second Power |  | First Difference Value | Second Difference Value |  | (After Replacement) First Difference Value | Second Difference Value |
|---|---|---|---|---|---|---|---|---|
| T81 | 654.0775 | 1081.465 | T81 | 1.634778 | 1.210704 | T81 | 1.634778 | 1.210704 |
| T82 | 656.0839 | 1083.122 | T82 | 2.006378 | 1.656419 | T82 | 2.006378 | 1.656419 |
| T83 | 698.9574 | 1125.86 | T83 | 42.891541 | 42.73836 | T83 | 42.89154 | 42.73836 |
|  | 732.375 | 1159.081 |  | 33.399625 | 33.22073 |  | 33.39963 | 33.22073 |
|  | 723.2574 | 1149.833 |  | −9.117622 | −9.24828 |  | −9.11762 | −9.24828 |
|  | 711.4629 | 1137.363 |  | −11.794518 | −12.4691 |  | −11.7945 | −12.4691 |
|  | 692.4874 | 1119.446 |  | −18.97551 | −17.9178 |  | −18.9755 | −17.9178 |
|  | 675.6552 | 1102.49 |  | −16.83224 | −16.956 |  | −16.8322 | −16.956 |
|  | 664.3818 | 1091.078 | ⇒ | −11.273377 | −11.4122 | ⇒ | −11.2734 | −11.4122 |
|  | 659.0152 | 1085.628 |  | −5.36624 | −5.44927 |  | −5.36662 | −5.44927 |
|  | 659.5666 | 1086.242 |  | 0.551472 | 0.614107 |  | 0.551472 | 0.614107 |
|  | 656.4615 | 1083.266 |  | −3.105149 | −2.97647 |  | −3.10515 | −2.97647 |
|  | 652.6181 | 1079.815 |  | −3.84337 | −3.45098 |  | −3.84337 | −3.45098 |
|  | 646.8817 | 1073.515 |  | −5.73643 | −6.3 |  | −5.73643 | −6.3 |
| T84 | 641.869 | 987.8519 | T84 | −5.012674 | −85.663 | T84 | −5.01267 | −5.01267 |
| T85 | 641.1169 | 565.0081 | T85 | −0.752068 | −422.844 | T85 | −0.75207 | −0.75207 |
|  | 634.6932 | 524.4248 |  | −6.423766 | −40.5833 |  | −6.42377 | −6.42377 |
|  | 630.1625 | 530.7838 |  | −4.530683 | 6.359049 |  | −4.53068 | 6.359049 |
|  | 627.9882 | 525.1905 |  | −2.174313 | −5.5933 |  | −2.17431 | −5.5933 |
|  | 625.512 | 523.7012 |  | −2.47617 | −1.48935 |  | −2.47617 | −1.48935 |
|  | 623.718 | 521.7259 |  | −1.793978 | −1.97527 |  | −1.79398 | −1.97527 |

FIG. 8

METHOD FOR IDENTIFYING ELECTRIC APPLIANCE AND APPARATUS AND SYSTEM THEREOF

CROSS-REFERENCE TO RELATED APPLICATION

This application claims the priority benefit of Taiwan application serial no. 102127311, filed on Jul. 30, 2013. The entirety of the above-mentioned patent application is hereby incorporated by reference herein and made a part of this specification.

TECHNICAL FIELD

The technical field relates to a method for identifying electric appliance and an apparatus and a system thereof.

BACKGROUND

As energy resources become scare and energy conservationism prevalent, the building of smart grids has long been the policy and goals strongly supported by many governments. The smart grid is a modern electric grid integrating power generation, delivery, distribution, and the end user, which is capable of reducing power usage and increasing user energy efficiency. The first step of realizing the smart grid is extensively implementing the smart meter and constructing the Advanced Metering Infrastructure (AMI), thereby replacing the traditional manual meter reading and enhancing the power usage efficiency. According to a research report from the Environmental Change Institute of Oxford University in England, 5-15% of an electricity bill can be saved per month on average if the user is able to obtain the data of the total household electricity usage. Research from the Energy Conversation Center of Japan has also pointed out by providing real-time energy consumption information individually to small business users, spontaneous intentions and actions related to energy conservation may be triggered, thereby saving approximately 20% of energy consumption. However, the user does not know which home appliances are the main contributors of the power consumption. Therefore, if the power signatures of specific major appliances can be provided to the user, then power consumption habits can be improved while enhancing the percentage of energy savings. Although the smart meter can measure the total energy consumption state of the household, the energy consumption of individual appliances cannot be measured.

Even though as early as 1992 George W. Hart has introduced the concept of nonintrusive appliance load monitoring (NALM) to analyze the power usage of the home appliances, not many researchers were attracted to this field. Not until the recent prevalence of smart meter has rapid development of related research began. Different from intrusive appliance load monitoring, a NALM system does not require the installation of an extra device on the individual appliance to determine whether the appliance is turned on or off, but requires obtaining the load characteristic values of the individual appliance in advance in order to determine the effect of the appliance load characteristics based on the information of a single electric meter. Accordingly, the possibility of real world implementation is drastically increased, because installing an extra device on each home appliance is not a suitable solution. In conventional techniques, appliance load monitoring utilizes a power meter or a smart meter to measure the power signatures of the appliances, then compares the power signatures to identify the usage state of each appliance, so as to provide the operational state information of more appliances. However, nonintrusive load identification methods are less accurate than intrusive methods, and especially so for 220V appliances, which occupy near 50% of the household energy consumption. This has a nontrivial effect on the adoption of nonintrusive load identification. Accordingly, an urgent issue to resolve is how to effectively identify the 220V appliances and to enhance the overall identification efficiency, and thereby calculate the power consumption of the 220V appliances.

Moreover, for most of the 220V appliances (air conditioning equipments being the most representative), the characteristics of the appliances have poor repeatability and the appliances may be easily affected by environmental factors, while the variable frequency air conditioning equipments may likely to adjust their operating states automatically. These factors result in the innate difficulties of using nonintrusive monitoring methods to identify the 220V appliances, and also resulting in the accuracy degradation in identifying other 110V appliances. The power usage of the 220V appliances is made even more difficult if the automatic changes of the variable frequency air conditioners are added. However, since 220V appliances occupy near 50% of the household energy consumption, inaccurate identification thereof results in the drastic reduction of the overall identification ability.

SUMMARY OF THE INVENTION

Accordingly, the disclosure provides a method for identifying an electric appliance and an apparatus and a system using the method, capable of identifying the electric appliance(s).

The disclosure provides an apparatus for identifying an electric appliance, including a collection unit and a processing unit. The collection unit respectively collects a first power event on a first phase power and a second power event on a second phase power. The processing unit is coupled to the collection unit, and the processing unit identifies whether an unknown electric appliance is a first type electric appliance or a second type electric appliance. When the collection unit collects at least one of the first power event and the second power event, the processing unit determines whether the first power event and the second power event substantially occur at the same time, in which at least one of the first power event and the second power event corresponds to the unknown electric appliance. If not, the unknown electric appliance is identified as the first type electric appliance. If yes, whether the first power event and the second power event are substantially the same is determined. If yes, the unknown electric appliance is identified as the second type electric appliance. If not, the unknown electric appliance is identified as the first type electric appliance.

The disclosure provides a method for identifying an electric appliance, adapted for an apparatus for identifying the electric appliance. The method includes the following steps. Respectively collect a first power event on a first phase power and a second power event on a second phase power. When at least one of the first power event and the second power event is collected, determine whether the first power event and the second power event substantially occur at the same time. At least one of the first power event and the second power event corresponds to the unknown electric appliance. If not, identify the unknown electric appliance as the first type electric appliance. If yes, determine whether the first power event and the second power event are substantially the same. If yes, identify the unknown electric appliance as the second type electric appliance. If not, identify the unknown electric appliance as the first type electric appliance.

In summary, when the first power event and/or the second power event is collected, the apparatuses and methods for identifying the electric appliance provided by the embodiments in the disclosure may determine whether the unknown electric appliance causing the first power event and/or the second power event belongs to the first type electric appliance or the second type electric appliance by observing the point of time when the first power event and the second power event occur, and also by observing whether the first power event and the second power event are the same.

Several exemplary embodiments accompanied with figures are described in detail below to further describe the disclosure in details.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

FIG. 8 is a table including the numerical variations of a first power, a second power, a first difference value, and a second difference value corresponding to different time points according to an exemplary embodiment.

DESCRIPTION OF EMBODIMENTS

Descriptions of the disclosure are given with reference to the exemplary embodiments illustrated with accompanied drawings. In addition, whenever possible, identical or similar reference numbers stand for identical or similar elements in the figures and the embodiments.

Figure 1:
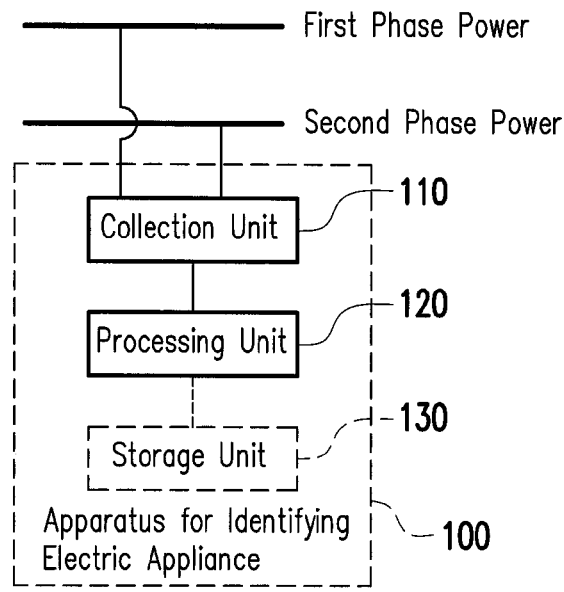
FIG. 1 is a schematic view of an apparatus for identifying an electric appliance according to an exemplary embodiment.

FIG. 1 is a schematic view of an apparatus for identifying an electric appliance according to an exemplary embodiment. The apparatus for identifying the electric appliance 100 may be an apparatus implementing nonintrusive load monitoring (NILM) identification techniques, and may be configured in the circuit boxes of buildings, for example, to monitor the power usage state of each electric appliance in the buildings (e.g. houses and offices). In the present embodiment, the apparatus for identifying the electric appliance 100 may respectively collect power events occurring on a first phase power and a second phase power.

The first phase power may be a 110V power source available commercially, and the second phase power may be a −110V power source (with a phase difference of 180° from the phase angle of the first phase power) available commercially, for example. Moreover, although FIG. 1 merely depicts the first phase power and the second phase power, typical commercial electric lines may further include a neutral power for providing a 0V power source. The first phase power, the second phase power, and the neutral power may form a three-wire single-phase power source. Under the framework of the three-wire single-phase power source, a user may connect each appliance to a power source corresponding to a required input power, such that the appliance may operate normally. In the embodiments provided by the disclosure hereafter, the three-wire single-phase power source is used as the basis for description, although the concept and spirit of the disclosure may also be applied in the frameworks of multi-wire single-phase power or multi-wire multi-phase power, and not only in the framework of three-wire single-phase power.

After collecting the power events occurring on the first phase power and/or the second phase power, the apparatus for identifying the electric appliance 100 may identify whether the electric appliance causing the power event is a first type electric appliance or a second type electric appliance according to the collected power events. The first type electric appliance may be an electric appliance suitable for using a 100-120V power source, and the second type electric appliance may be an electric appliance suitable for using a 200-240V power source, although the disclosure is not limited thereto. To facilitate description, it is assumed hereafter that the first type electric appliance and the second type electric appliance are electric appliances respectively suitable for using 110 and 220V power sources. In specifics, when an electric appliance is turned on (or turned off) within a monitoring range of the apparatus for identifying the electric appliance 100, the apparatus 100 may collect a variation of the electrical characteristics (e.g. power events) on the first phase power and/or the second phase power. The electrical characteristics may be real power, reactive power, apparent power, power factor, current, and harmonics, although the disclosure is not limited thereto. Thereafter, the apparatus for identifying the electric appliance 100 may identify whether the electric appliance being turned on (or turned off) at the moment is the first type electric appliance or the second type electric appliance according to the respective electrical characteristics of the first phase power and the second phase power. Several embodiments are described in the following to illustrate the disclosure in detail.

With reference to FIG. 1, the apparatus for identifying the electric appliance 100 includes a collection unit 110 and a processing unit 120. The collection unit 110 may respectively collect a first power event on a first phase power and a second power event on a second phase power. As described earlier, the first power event may be a variation of the electrical characteristics occurring on the first phase power, and the second power event may be a variation of the electrical characteristics occurring on the second phase power. In the present embodiment, a designer may select different instruments to implement the collection unit 110 according to the electrical characteristics to monitor, such as current sensing devices, voltage sensing devices, or power sensing devices, or simultaneously using different sensing devices. For example, if the collection unit 110 is used for collecting the state of current variation, then the designer may adopt a first current sensing device and a second current sensing device to implement the collection unit 110, so as to respectively collect the current variations on the first phase power and the second phase power. In another example, if the collection unit 110 is used for collecting the state of power variation, then the designer may adopt a first power sensing device and a second power sensing device to implement the collection unit 110, so as to respectively collect the power variations on the first phase power and the second phase power. In other embodiments, when the designer seeks to monitor electrical characteristics such as reactive power, apparent power, power factor, or harmonics, the designer may adopt the corresponding instruments for collection.

The processing unit 120 is coupled to the collection unit 110, and the processing unit 120 identifies whether an unknown electric appliance is a first type electric appliance or a second type electric appliance. The unknown electric appliance may be an electric appliance causing the first power event and/or the second power event. The processing unit 120 may be a general purpose processor, a specific purpose processor, a traditional processor, a digital signal processor, a plurality of microprocessors, one or a plurality of microprocessors integrating digital signal processing cores, a controller, a microcontroller, an Application Specific Integrated Circuit (ASIC), a Field Programmable Gate Array (FPGA), other types of integrated circuits, a state machine, an Advanced RISC Machine (ARM) processor, or similar products.

In other embodiments, the apparatus for identifying the electric appliance 100 may further include a storage unit 130 coupled to the processing unit 120. The storage unit 130 may store a plurality of power signatures corresponding to a plurality of electric appliances. The electric appliances may be each of the electric appliances located within the monitoring range of the apparatus for identifying the electric appliance 100. The power signatures may be the voltage, current, real power, reactive power, power factor, and apparent power of the electric appliances, although the disclosure is not limited thereto. The storage unit 130 may be a flash type memory, a hard disk type memory, a multimedia card storage medium, a card type memory (e.g. Secure Digital (SD) memory or Extreme Digital (XD) memory), a random access memory (RAM), and/or a read-only memory (ROM). The storage unit 130 may store various types of software program codes, embedded software, or the required embedded firmware of the apparatus for identifying the electric appliance 100, although the disclosure is not limited thereto.

Figure 2:
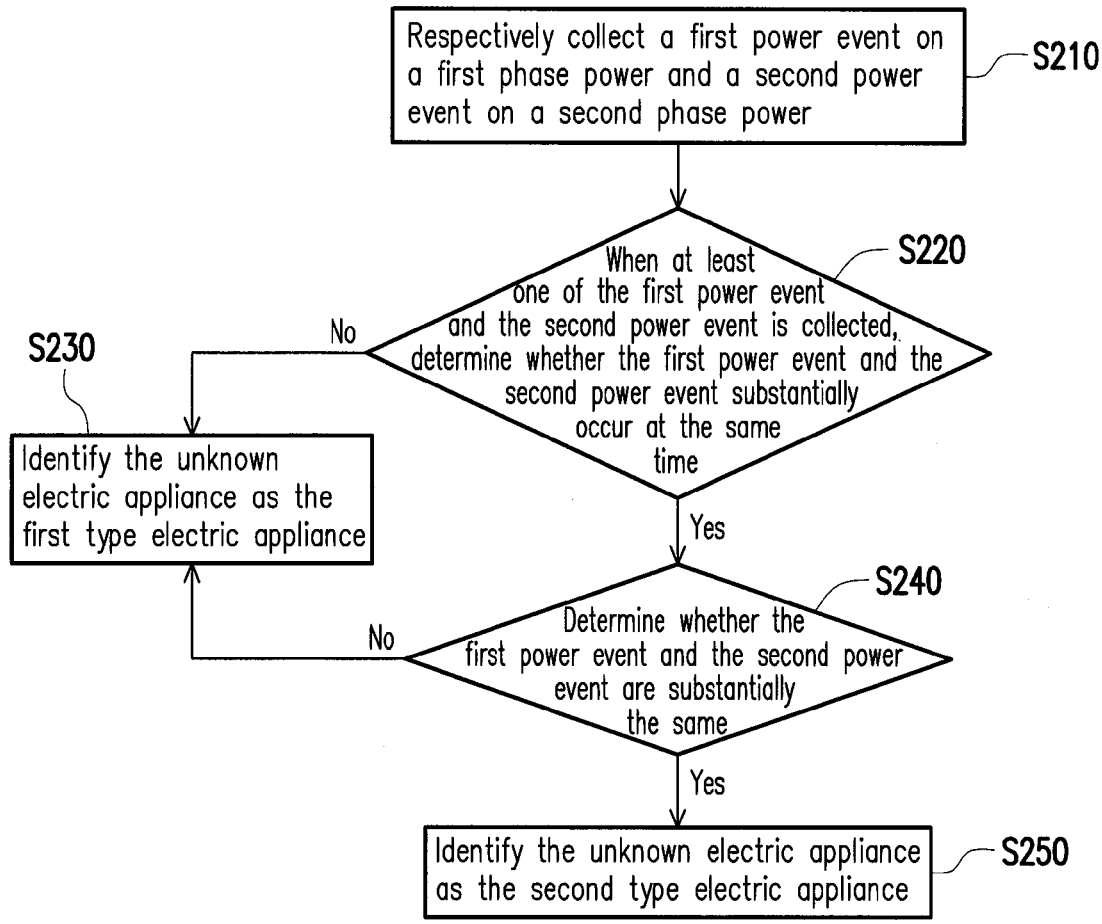
FIG. 2 is a flow diagram of a method for identifying an electric appliance according to an exemplary embodiment.

FIG. 2 is a flow diagram of a method for identifying an electric appliance according to an exemplary embodiment. The method described in the present embodiment is suitable for use by the apparatus for identifying the electric appliance 100 depicted in FIG. 1, and descriptions of each step in the present embodiment are given with reference to each accompanying element illustrated in FIG. 1.

With reference to FIGS. 1 and 2, in Step S210, the collection unit 110 may respectively collect a first power event on a first phase power and a second power event on a second phase power. In specifics, the collection unit 110 may actively detect the first power event and the second power event, or passively receive the first power event and the second power event detected by other devices (e.g. electric meters), although the disclosure is not limited thereto. In Step S220, when the collection unit 110 collects at least one of the first power event and the second power event, the processing unit 120 determines whether the first power event and the second power event substantially occur at the same time. If not, then the process proceeds to Step S230; and if yes, the process proceeds to Step S240.

In Step S230, the processing unit 120 may identify the unknown electric appliance as the first type electric appliance. To be specific, in the present embodiment, since the first type electric appliance is defined as suitable for using the 110V power source, therefore, when a first electric appliance belonging to the first type electric appliance is connected to the three-wire single-phase power framework, the first electric appliance is connected to the first phase power (110V) or the second phase power (−110V) at the same time when the first electric appliance is connected to the neutral power (0V). Thus, when the first electric appliance is turned on (or turned off), the electrical characteristics of the first phase power or the second phase power change, and accordingly the electrical characteristics of the first phase power and the second phase power do not vary at the same time. In other words, when the first power event and/or the second power event corresponding to the unknown electric appliance is collected, and the first power event and the second power event do not substantially occur at the same time, only one of the first power event or the second power event has occurred at this time. Therefore, the processing unit 120 can determine that the unknown electric appliance causing one of the first power event and the second power event is the first type electric appliance. Moreover, in Step S230, the unknown electric appliance is identified by the processing unit 120 as the first type electric appliance.

In Step S240, the processing unit 120 may determine whether the first power event and the second power event are substantially the same. In other words, the processing unit 120 may determine whether the variations of the electrical characteristics on the first phase power and the variations of the electrical characteristics on the second phase power are substantially the same. If not, then the process proceeds to Step S230; and if yes, the process proceeds to Step S250.

To be specific, in the present embodiment, since the second type electric appliance is defined as suitable for using the 220V power source, therefore, when a second electric appliance belonging to the second type electric appliance is connected to the three-wire single-phase power framework, the second electric appliance connects to the first phase power (110V) and the second phase power (−110) at the same time, so as to obtain an input power of 220V (i.e. 110−(−110)=220V). Therefore, when the second electric appliance is turned on (or turned off), substantially the same variation of the electrical characteristics occurs on the first phase power and the second phase power at the same time. In other words, when the first power event and the second power event substantially occur on a same time point, the turned on (or turned off) unknown electric appliance is the second type electric appliance. Therefore, the processing unit 120 can determine that the unknown electric appliance causing the first power event and the second power event at the same time is the second type electric appliance. Moreover, in Step S250, the unknown electric appliance is identified by the processing unit 120 as the second type electric appliance.

However, when the first power event and the second power event substantially occur at a same time point, if the first power event and the second power event are substantially different, the first power event and the second power event may respectfully correspond to a plurality of electric appliances turning on (or turning off) at the same time which belong to the first type electric appliance. Therefore, the processing unit 120 can determine that the unknown electric appliance causing the first power event and the second power event at the same time is the first type electric appliance. Moreover, in Step S230, the unknown electric appliance is identified by the processing unit 120 as the first type electric appliance.

Accordingly, in the methods and apparatuses provided in the disclosure, when the first power event and/or the second power event is collected, whether the unknown electric appliance causing the first power event and/or the second power event is the first type electric appliance or the second type electric appliance may be determined by observing the time point when the first power event and the second power event occurred, and by observing whether the first power event and the second power event are the same.

Figure 3:
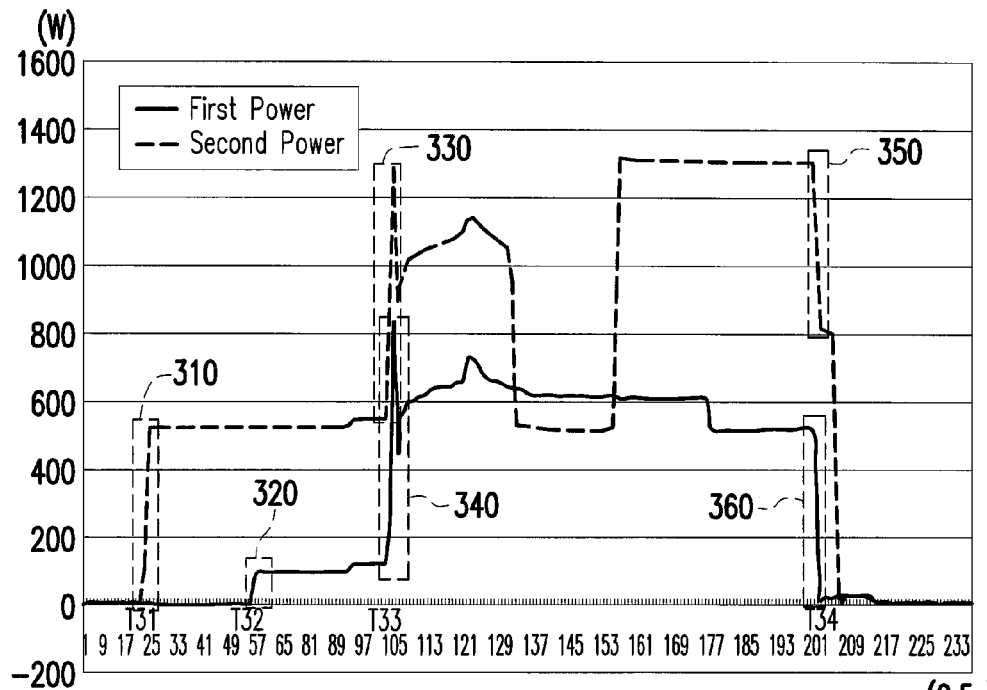
FIG. 3 depicts schematic views of the respective electrical characteristics of a first phase power and a second phase power according to an exemplary embodiment.

FIG. 3 depicts schematic views of the respective electrical characteristics of a first phase power and a second phase power according to an exemplary embodiment. In the present embodiment, the observed electrical characteristics of the first phase power and the second phase power may respectively represent a first power and a second power. The spirit of the present embodiment is described below with reference to FIGS. 1, 2 and 3.

As shown in FIG. 3, at a time point T31, the second power of the second phase power changes (i.e., a second power event 310 occurs). At this time, since the first power of the first phase power has not changed at the same time (i.e., the first power event has not occurred), therefore, when the processing unit 120 executes Step S220, the first power event and the second power event 310 are determined to not have substantially occurred at the same time, and accordingly the process proceeds to Step S230. Therefore, the processing unit 120 can identify the unknown electric appliance corresponding to the second power event 310 as the first type electric appliance. Moreover, since the second power changes at the time point T31 by increasing in power, therefore, the processing unit 120 may further determine that the unknown electric appliance corresponding to the second power event 310 is turned on at the time point T31.

At a time point T32, a change in the first power of the first phase power can be observed (i.e., a first power event 320 occurs). At this time, since the second power of the second phase power has not changed at the same time (i.e., the second power event has not occurred), therefore, when the processing unit 120 executes Step S220, the first power event 320 and the second power event are determined to not have substantially occurred at the same time, and accordingly the process proceeds to Step S230. Therefore, the processing unit 120 can identify the unknown electric appliance corresponding to the first power event 320 as the first type electric appliance. Moreover, since the first power changes at the time point T32 by increasing in power, therefore, the processing unit 120 may further determine that the unknown electric appliance corresponding to the first power event 320 is turned on at the time point T32.

At a time point T33, the variations in the first power and in the second power can be observed at the same time (i.e., a first power event 340 and a second power event 330 occur at the same time). Therefore, after the processing unit 120 executes Step S220, the process proceeds to Step S240 to determine whether the first power event 340 and the second power event 330 are substantially the same. In the present embodiment, since the first power event 340 and the second power event 330 are quite similar, therefore, the processing unit 120 can determine that the first power event 340 and the second power event 330 are substantially the same, and the process proceeds to Step S250. Accordingly, the processing unit 120 can identify the unknown electric appliance corresponding to the first power event 340 and the second power event 330 as the second type electric appliance. Moreover, since the first power and the second power change at the time point T33 by increasing in power, therefore, the processing unit 120 may further determine that the unknown electric appliance corresponding to the first power event 340 and the second power event 330 is turned on at the time point T33.

At a time point T34, the variations in the first power and in the second power can be observed at the same time (i.e., a first power event 360 and a second power event 350 occur at the same time). Therefore, after the processing unit 120 executes Step S220, the process proceeds to Step S240 to determine whether the first power event 360 and the second power event 350 are substantially the same. In the present embodiment, since the first power event 360 and the second power event 350 are quite similar, therefore, the processing unit 120 can determine that the first power event 360 and the second power event 350 are substantially the same, and the process proceeds to Step S250. Accordingly, the processing unit 120 can identify the unknown electric appliance corresponding to the first power event 360 and the second power event 350 as the second type electric appliance. Moreover, since the first power and the second power change at the time point T34 by decreasing in power, therefore, the processing unit 120 may further determine that the unknown electric appliance corresponding to the first power event 360 and the second power event 350 is turned off at the time point T34.

In other embodiments, after identifying the unknown electric appliance is the first type electric appliance or the second type electric appliance, the methods provided in the disclosure may further analyze the electrical characteristics of the first phase power and the second phase power, so as to obtain more information related to the unknown electric appliance.

Figure 4:
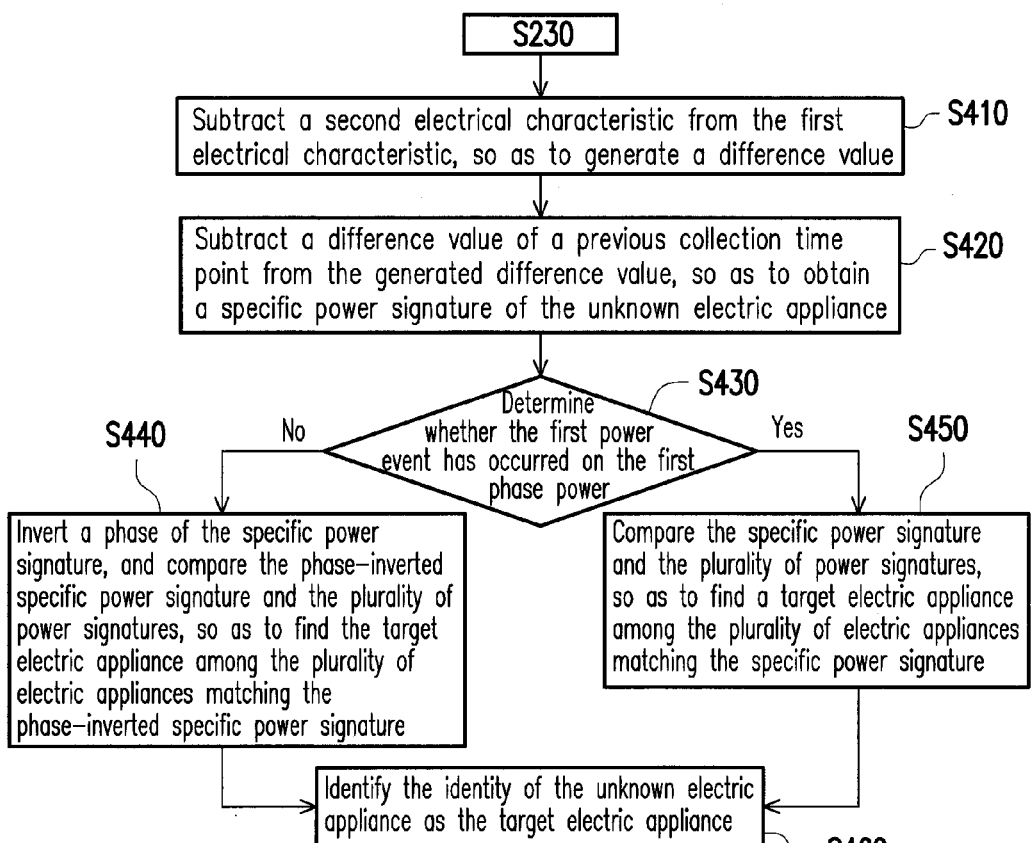
FIG. 4 is a flow diagram of a method for identifying an identify of an electric appliance according to an exemplary embodiment.

FIG. 4 is a flow diagram of a method for identifying an identify of an electric appliance according to an exemplary embodiment. The method described in the present embodiment is suitable for use by the apparatus for identifying the electric appliance 100 depicted in FIG. 1, and descriptions of each step in the present embodiment are given with reference to each accompanying element illustrated in FIG. 1. In the present embodiment, after the processing unit 120 executes Step S230 in FIG. 2 (i.e., identifying the unknown electric appliance as the first type electric appliance), the process may then execute Steps S410-S460, so as to further identify the identity of the unknown electric appliance belonging to the first type electric appliance. Detailed explanations are given below.

In Step S410, the processing unit 120 generates a difference value by subtracting a second electrical characteristic from a first electrical characteristic. The first electrical characteristic may be the electrical characteristic of the first phase power, and the second electrical characteristic may be the electrical characteristic of the second phase power. In specifics, since the first electrical characteristic and the second electrical characteristic may respectively include the power signatures of a plurality of electric appliances belonging to the second type electric appliance, therefore, by executing the operations in Step S410, the power signatures of the plurality of electric appliances belonging to the second type electric appliance may be eliminated. In other words, by executing the operations in Step S410, the difference in the effect (e.g. the difference value) on the first electrical characteristic and the second electrical characteristic when the unknown electric appliance is turned on (or turned off) can be retrieved. For example, when the first electrical characteristic is the first power of the first phase power, the second electrical characteristic is the second power of the second phase power, then when the difference value is 100 W, this represents on the observation time point, a total power of the first type electric appliance of the first phase power is greater than a total power of the first type electric appliance of the second phase power by 100 W. At the same time, the effect of the second type electric appliance has been eliminated in the difference value.

Therefore, in Step S420, the processing unit 120 may subtract a difference value of a previous collection time point from the generated difference value, so as to obtain a specific power signature of the unknown electric appliance. Alternatively, in other embodiments, the processing unit 120 may also obtain the specific power signature of the unknown electric appliance by respectively observing the variations of the first electrical characteristic and the second electrical characteristic. For example, when the first electrical characteristic changes, the processing unit 120 may determine whether a variation amount of the first electrical characteristic has surpassed a first threshold. If yes, the processing unit 120 may record the variation amount of the first electrical characteristic corresponding to the time point at the moment. Thereafter, the processing unit 120 may determine whether a specific difference value between the variation amount of the first electrical characteristic corresponding to the time point at the moment and the variation amount of the first electrical characteristic corresponding to the previous recorded time point has surpassed a second threshold. If yes, the processing unit 120 may view the specific difference value as the specific power signature of the unknown electric appliance, although embodiments of the disclosure are not limited thereto. Moreover, when the second electrical characteristic changes, the processing unit 120 may also employ the afore-described methods to obtain the specific power signature of the unknown electric appliance, and further elaboration thereof is omitted hereafter.

However, since the connection method between the unknown electric appliance and the three-wire single-phase power framework is not yet confirmed, whether the specific power signature is the power signature of the unknown electric appliance cannot be ascertained. In specifics, when the unknown electric appliance is the first type electric appliance, since it cannot be confirmed whether the unknown electric appliance is connected to the three-wire single-phase power framework by connecting to the neutral power and the first phase power at the same time, or the unknown electric appliance is connected to the three-wire single-phase power framework by connecting to the neutral power and the second phase power at the same time, therefore, whether the specific power signature corresponds to the power signature of the unknown electric appliance cannot be ascertained. Accordingly, the processing unit 120 may execute Step S430 to determine the connection method of the unknown electric appliance and the three-wire single-phase power framework.

In Step S430, the processing unit 120 may determine whether the first power event has occurred on the first phase power. If yes, the process proceeds to Step S450. In specifics, since the generated difference value is calculated by subtracting the second electrical characteristic from the first electrical characteristic, therefore, if the first power event has occurred on the first phase power at the moment, this confirms that the specific power signature is the power signature of the unknown electric appliance. Accordingly, in Step S450, the processing unit 120 may compare the specific power signature and the plurality of power signatures, so as to find a target electric appliance among the plurality of electric appliances matching the specific power signature. In specifics, the processing unit 120 may search each of the power signatures stored in the storage unit 130, so as to find whether the storage unit 130 has the target electric appliance having a power signature matching the power signature of the unknown electric appliance. If yes, this represents the identity of the unknown electric appliance is the target electric appliance.

However, if the processing unit 120 determines in Step S430 that the first power event has not occurred on the first phase power, this represents that the specific power signature is not the power signature of the unknown electric appliance, but the power signature of the unknown electric appliance after phase inversion. Accordingly, in Step S440, the processing unit 120 may invert the phase of the specific power signature, and compare the phase-inverted specific power signature and the plurality of power signatures, so as to find the target electric appliance among the plurality of electric appliances matching the phase-inverted specific power signature. In specifics, the processing unit 120 may obtain the power signature of the unknown electric appliance by using the phase-inverted specific power signature. Thereafter, the processing unit 120 may search each of the power signatures stored in the storage unit 130, so as to find whether the storage unit 130 has the target electric appliance having a power signature matching the power signature of the unknown electric appliance. If yes, this represents the identity of the unknown electric appliance is the target electric appliance.

After Steps S440 and S450, the processing unit 120 may execute Step S460 to identify the identity of the unknown electric appliance as the target electric appliance. In brief, the method provided in the present embodiment further analyzes the first electrical characteristic and the second electrical characteristic when the unknown electric appliance has been determined to be the first type electric appliance, so as to identify the true identity of the unknown electric appliance. Accordingly, through the method provided by the present embodiment, the apparatus for identifying the electric appliance 100 may further provide an identity information of the unknown electric appliance to the user, such that the user can clearly grasp the operational state of the electric appliance.

Figure 5:
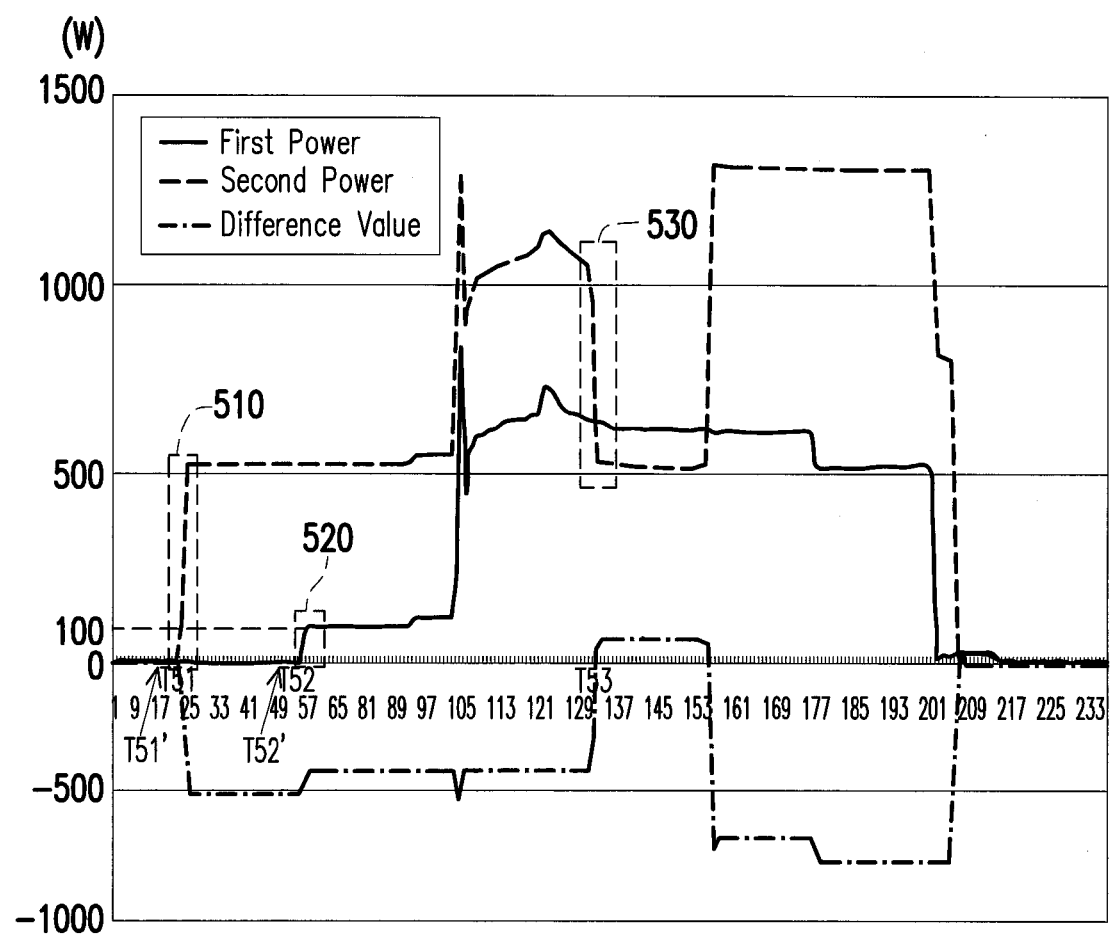
FIG. 5 depicts schematic views of the respective electrical characteristics of a first phase power and a second phase power according to an exemplary embodiment.

FIG. 5 depicts schematic views of the respective electrical characteristics of a first phase power and a second phase power according to an exemplary embodiment. In the present embodiment, the observed electrical characteristics of the first phase power and the second phase power may respectively represent a first power and a second power. The spirit of the present embodiment is described below with reference to FIGS. 1, 4 and 5.

As shown in FIG. 5, at a time point T51, the processing unit 120 may calculate the difference value to be −500 by executing Step S410. Thereafter, the processing unit 120 may determine the specific power signature of the unknown electric appliance to be −500 W by executing Step S420. In specifics, the processing unit 120 may subtract a difference value (approximately 0 W) of a previous collection time point (e.g. a time point T51') from the difference value (approximately −500 W) of the time point T51, so as to calculate the specific power signature to be approximately −500 W. At this time, since the unknown electric appliance causes a variation (i.e. a second power event 510) of the second power on the second phase power, therefore, the unknown electric appliance may be connected to the three-wire single-phase power framework by connecting to the neutral power and the second phase power at the same time. In other words, the power signature of the unknown electric appliance is the phase-inverted specific power signature (i.e. 500 W). Therefore, the processing unit 120 may subsequently execute Step S440, so as to find a target electric appliance (e.g. a blow-dryer) having a power signature of 500 W in the storage unit 130. Thereafter, the processing unit 120 in Step S460 may identify the identity of the unknown electric appliance as the target electric appliance (e.g. the blow-dryer). Moreover, since the second power changes at the time point T51 by increasing in power, therefore, the processing unit 120 may further determine that the unknown electric appliance (e.g. the blow-dryer) corresponding to the second power event 510 is turned on at the time point T51.

At a time point T52, the processing unit 120 may calculate the difference value to be approximately 100 by executing Step S410. Thereafter, the processing unit 120 may determine the specific power signature of the unknown electric appliance to be 100 W by executing Step S420. In specifics, the processing unit 120 may subtract a difference value (approximately −500 W) of a previous collection time point (e.g. a time point T52') from the difference value (approximately −400 W) of the time point T52, so as to calculate the specific power signature to be approximately 100 W. At this time, since the unknown electric appliance causes a variation (i.e. a first power event 520) of the first power on the first phase power, therefore, the unknown electric appliance may be connected to the three-wire single-phase power framework by connecting to the neutral power and the first phase power at the same time. In other words, the specific power signature is the power signature of the unknown electric appliance (i.e. 100 W). Therefore, the processing unit 120 may subsequently execute Step S450, so as to find a target electric appliance (e.g. a light bulb) having a power signature of 100 W in the storage unit 130. Thereafter, the processing unit 120 in Step S460 may identify the identity of the unknown electric appliance as the target electric appliance (e.g. the light bulb). Moreover, since the first power changes at the time point T52 by increasing in power, therefore, the processing unit 120 may further determine that the unknown electric appliance (e.g. the light bulb) corresponding to the first power event 520 is turned on at the time point T52.

At a time point T53, the processing unit 120 may calculate the difference value by executing Step S410. Thereafter, the processing unit 120 may determine the specific power signature of the unknown electric appliance by executing Step S420. At this time, since the unknown electric appliance causes a variation (i.e. a second power event 530) of the second power on the second phase power, therefore, the unknown electric appliance may be connected to the three-wire single-phase power framework by connecting to the neutral power and the second phase power at the same time. In other words, the power signature of the unknown electric appliance is the phase-inverted specific power signature. Therefore, the processing unit 120 may subsequently execute Step S440, so as to find a target electric appliance (e.g. the blow-dryer) in the storage unit 130. Thereafter, the processing unit 120 in Step S460 may identify the identity of the unknown electric appliance as the target electric appliance (e.g. the blow-dryer). Moreover, since the second power changes at the time point T53 by decreasing in power, therefore, the processing unit 120 may further determine that the unknown electric appliance (e.g. the blow-dryer) corresponding to the second power event 530 is turned off at the time point T53.

Figure 6:
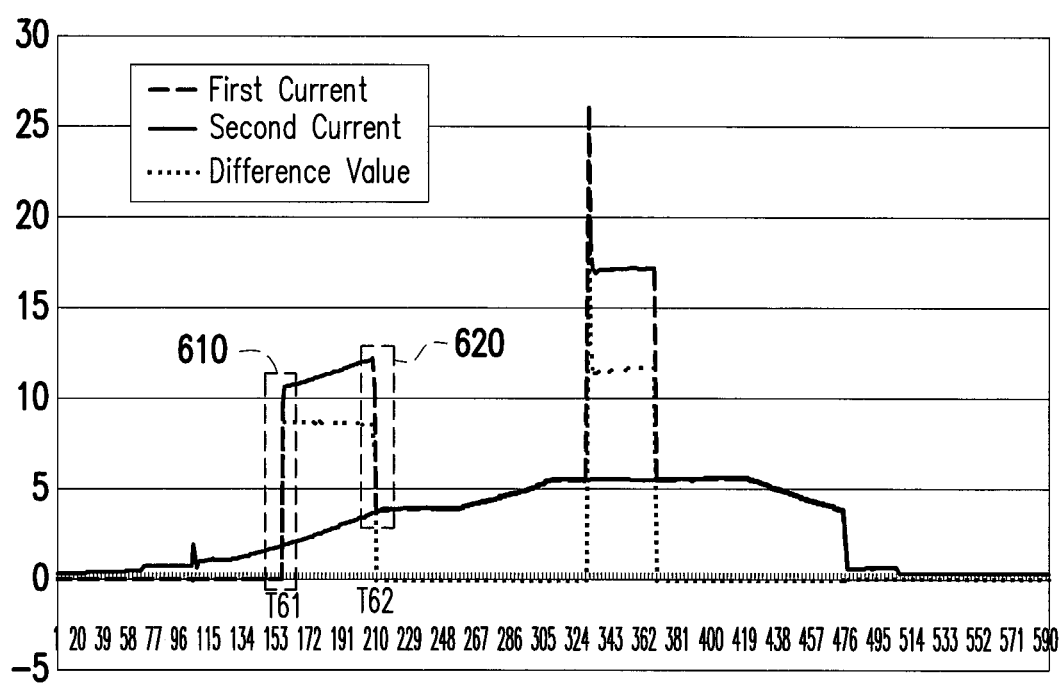
FIG. 6 depicts schematic views of the respective electrical characteristics of a first phase power and a second phase power according to an exemplary embodiment.

FIG. 6 depicts schematic views of the respective electrical characteristics of a first phase power and a second phase power according to an exemplary embodiment. In the present embodiment, the observed electrical characteristics of the first phase power and the second phase power may respectively represent a first current and a second current. The spirit of the present embodiment is described below with reference to FIGS. 1, 4 and 6.

As shown in FIG. 6, at a time point T61, the processing unit 120 may calculate the difference value by executing Step S410. Thereafter, the processing unit 120 may determine the specific power signature of the unknown electric appliance by executing Step S420. At this time, since the unknown electric appliance causes a variation (i.e. a first power event 610) of the first current on the first phase power, therefore, the unknown electric appliance may be connected to the three-wire single-phase power framework by connecting to the neutral power and the first phase power at the same time. In other words, the specific power signature is the power signature of the unknown electric appliance. Therefore, the processing unit 120 may subsequently execute Step S450, so as to find a target electric appliance (e.g. the blow-dryer) in the storage unit 130. Thereafter, the processing unit 120 in Step S460 may identify the identity of the unknown electric appliance as the target electric appliance (e.g. the blow-dryer). Moreover, since the first current changes at the time point T61 by increasing in current, therefore, the processing unit 120 may further determine that the unknown electric appliance (e.g. the blow-dryer) corresponding to the first power event 610 is turned on at the time point T61.

At a time point T62, the processing unit 120 may calculate the difference value by executing Step S410. Thereafter, the processing unit 120 may determine the specific power signature of the unknown electric appliance by executing Step S420. At this time, since the unknown electric appliance causes a variation (i.e. a first power event 620) of the first current on the first phase power, therefore, the unknown electric appliance may be connected to the three-wire single-phase power framework by connecting to the neutral power and the first phase power at the same time. In other words, the specific power signature is the power signature of the unknown electric appliance. Therefore, the processing unit 120 may subsequently execute Step S440, so as to find a target electric appliance (e.g. the blow-dryer) in the storage unit 130. Thereafter, the processing unit 120 in Step S460 may identify the identity of the unknown electric appliance as the target electric appliance (e.g. the blow-dryer). Moreover, since the first current changes at the time point T62 by decreasing in current, therefore, the processing unit 120 may further determine that the unknown electric appliance (e.g. the blow-dryer) corresponding to the first power event 620 is turned off at the time point T62.

In addition, while knowing the identity of the unknown electric appliance, the apparatus for identifying the electric appliance 100 may calculate a power consumed by the unknown electric appliance according to the power signature thereof and an operation time. Furthermore, the apparatus for identifying the electric appliance 100 may add the respective power consumed by all of the electric appliances belonging to the first type electric appliance, so as to calculate a total power consumed by these electric appliances. Therefore, by using the method in the present embodiment, the apparatus for identifying the electric appliance 100 may provide detailed electrical/power information to the user, such as, the total power consumed by all of the electric appliances belonging to the first type electric appliance, for example.

In other embodiments, while knowing the unknown electric appliance belongs to the second type electric appliance, the disclosure may further use the following methods to estimate a total power consumed by all of the electric appliances belonging to the second device. Broadly speaking, the following methods calculate the total power consumed corresponding to a first time point by the second type electric appliance according to a first difference value and a second difference value. The first time point is a time point on which the first power of the first phase power changes, or the second power of the second phase power changes. The first difference value is a difference value between the first power of the first phase power at the first time point and the first power of the first phase power at the second time point. The second time point is a collection time point before the first time point. The second difference value is a difference between the second power of the second phase power at the first time point and the second power of the second phase power at the second time point. Detailed explanations are given below.

Figure 7:
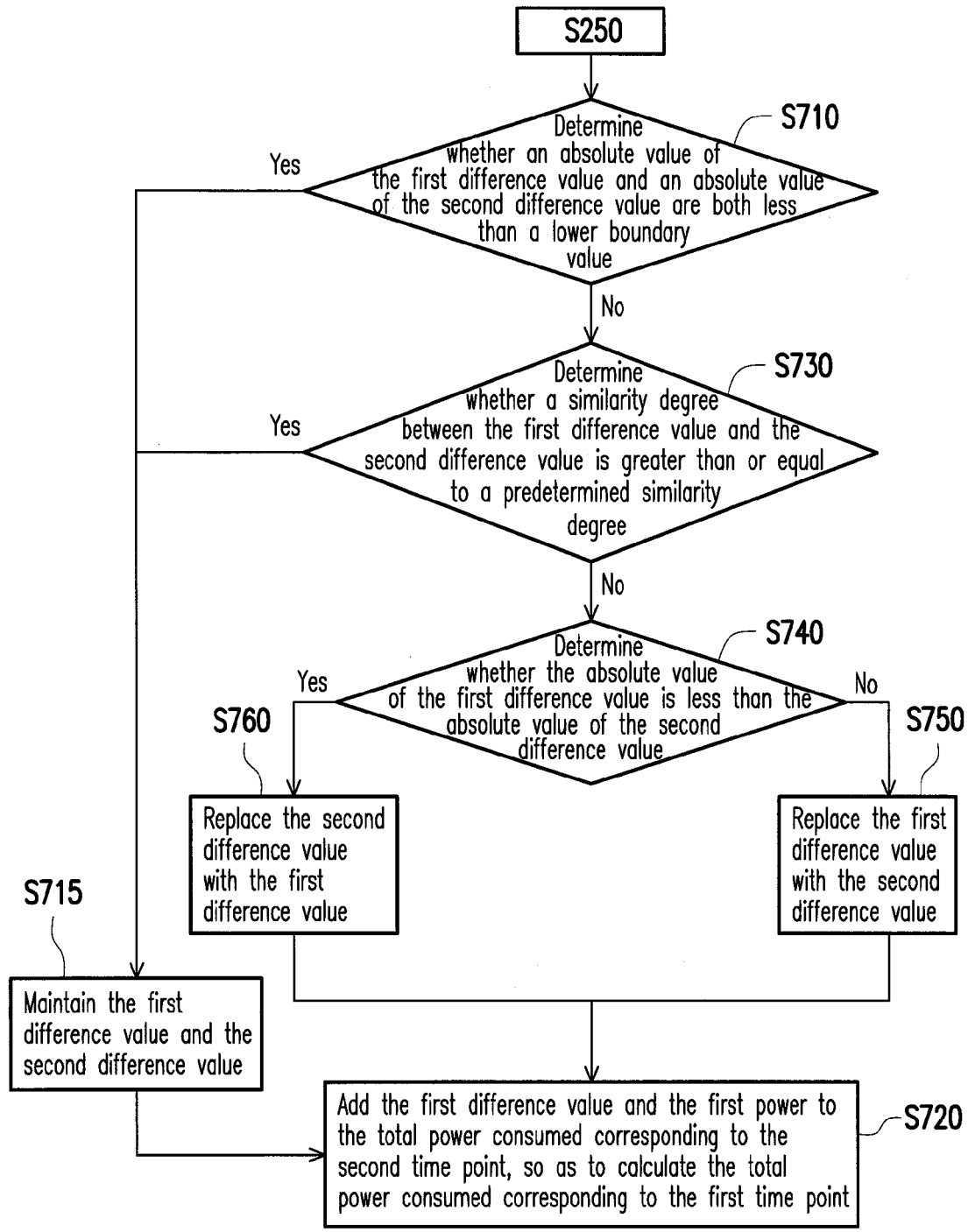
FIG. 7 is a flow diagram of a method for calculating a total power consumed according to an exemplary embodiment.

FIG. 7 is a flow diagram of a method for calculating a total power consumed according to an exemplary embodiment. The method described in the present embodiment is suitable for use by the apparatus for identifying the electric appliance 100 depicted in FIG. 1, and descriptions of each step in the present embodiment are given with reference to each accompanying element illustrated in FIG. 1. In the present embodiment, after the processing unit 120 executes Step S250 in FIG. 2 (i.e., identifying the unknown electric appliance as the second type electric appliance), the process may then proceed to Steps S710-S770, so as to further calculate the total power consumed by all of the electric appliances belonging to the second type electric appliance.

In Step 710, the processing unit 120 may determine whether an absolute value of the first difference value and an absolute value of the second difference value are both less than a lower boundary value. If yes, the processing unit 120 may then execute Step S715 to maintain the first difference value and the second difference value.

In Step S720, the processing unit 120 may add the first difference value and the first power to the total power consumed corresponding to the second time point, so as to calculate the total power consumed corresponding to the first time point. From another perspective, a sum of the first difference value and the first power represents a power consumed by all of the electric appliances belonging to the second type electric appliance on the first time point. Moreover, the total power consumed corresponding to the second time point may be viewed as the total power consumed by all of the electric appliances belonging to the second type electric appliance before the second time point. Therefore, the total power consumed corresponding to the first time point may be calculated by adding the first difference value and the first power to the total power consumed corresponding to the second time point.

In other embodiments, when the absolute value of the first difference value and the absolute value of the second difference value are both less than the lower boundary value, this represents the first difference value and the second difference value may be close to each other. Therefore, in Step S720, the processing unit 120 may also add the second difference value and the second power to the total power consumed corresponding to the second time point, so as to calculate the total power consumed corresponding to the first time point.

On the other hand, when the absolute value of the first difference value and the absolute value of the second difference value are not less than the lower boundary value, then after Step S710, the processing unit 120 may execute Step S730. In Step S730, the processing unit 120 may determine whether a similarity degree between the first difference value and the second difference value is greater than or equal to a predetermined similarity degree. The similarity degree may be obtained by subtracting the first difference value from the second difference value and taking the absolute value, then dividing by a sum of the absolute value of the first difference value and the absolute value of the second difference value, although the disclosure is not limited thereto. When the similarity degree between the first difference value and the second difference value is greater than or equal to the predetermined similarity degree, the processing unit 120 may subsequently execute Steps S715 and S720. The detailed descriptions of Steps S715 and S720 may be referenced to the earlier disclosure, and therefore further elaboration thereof is omitted hereafter.

However, when the similarity degree between the first difference value and the second difference value is not greater than or equal to the predetermined similarity degree, this represents a power variation of the first type electric appliance is included in the first difference value or the second difference value at this time. Therefore, the processing unit 120 may then execute Step S740 to determine whether the absolute value of the first difference value is less than the absolute value of the second difference value.

When the absolute value of the first difference value is less than the absolute value of the second difference value, the processing unit 120 may then execute Step S760. In Step S760, the processing unit 120 may use the first difference value to replace the second difference value. In other words, since the second difference value corresponds to the variation of the power consumed by the first type electric appliance, therefore, by using the operations in Step S760, the effect of the variation of the power consumed by the first type electric appliance on the calculation of the total power consumed by the second type electric appliance may be eliminated. Accordingly, the processing unit 120 may subsequently execute Step S720. The detailed descriptions of Step S720 may be referenced to the earlier disclosure, and therefore further elaboration thereof is omitted hereafter.

On the other hand, in Step S740, when the absolute value of the first difference value is not less than the absolute value of the second difference value, the processing unit 120 may then execute Step S750. In Step S750, the processing unit 120 may use the second difference value to replace the first difference value. In other words, since the first difference value corresponds to the variation of the power consumed by the first type electric appliance, therefore, by using the operations in Step S760, the effect of the variation of the power consumed by the first type electric appliance on the calculation of the total power consumed by the second type electric appliance may be eliminated. Accordingly, the processing unit 120 may subsequently execute Step S720. The detailed descriptions of Step S720 may be referenced to the earlier disclosure, and therefore further elaboration thereof is omitted hereafter.

In brief, the method provided in the present embodiment further analyzes the first electrical characteristic and the second electrical characteristic when the unknown electric appliance has been determined to be the second type electric appliance, so as to calculate the total power consumed by the second type electric appliance. Therefore, through the method provided by the present embodiment, the apparatus for identifying the electric appliance 100 may further provide a total power consumed related to the second type electric appliance to the user, such that the user can clearly grasp the operational state of the electric appliance.

FIG. 8 is a table including the numerical variations of a first power, a second power, a first difference value, and a second difference value corresponding to different time points according to an exemplary embodiment. The spirit of the present embodiment is described below with reference to FIGS. 1, 7 and 8.

As shown in FIG. 8, a first difference value (2.006378) and a second difference value (1.656419) corresponding to a time point T82 may be calculated by respectively subtracting a first power (654.0775) and a second power (1081.465) corresponding to a time point T81 (e.g., a collection time point before the time point T82) from a first power (656.0839) and a second power (1083.122) corresponding to the time point T82. At the time point T82, the processing unit 120 may determine whether the first difference value (2.006378) and the second difference value (1.656419) are both less than a lower boundary value (e.g. 10), and accordingly the processing unit 120 executes Steps S715 and S720 after Step S710.

Using a time point T83 as an example, a first difference value (42.891541) and a second difference value (42.73836) corresponding to the time point T83 may be calculated by respectively subtracting the first power (656.0839) and the second power (1083.122) corresponding to the time point T82 (e.g., a collection time point before the time point T83) from a first power (698.9754) and a second power (1125.86) corresponding to the time point T83. At the time point T83, the processing unit 120 may determine whether the absolute value of the first difference value (42.891541) and the absolute value of the second difference value (42.73836) are not less than the lower boundary value (e.g. 10), and accordingly the processing unit 120 executes Step S730 after Step S710. However, since the similarity degree between the first difference value and the second difference value is greater than the predetermined similarity degree (e.g. 80%), therefore, after Step S730, the processing unit 120 may subsequently execute Steps S715 and S720, and the detailed descriptions thereof are omitted hereafter.

Using a time point T84 as an example, a first difference value (−5.012674) and a second difference value (−85.663) corresponding to the time point T84 may be calculated by reference to the earlier disclosure, and therefore further elaboration thereof is omitted hereafter. At the time point T84, the processing unit 120 subsequently executes Step S730 because the absolute value of the second difference value (−85.663) is greater than the lower boundary value (e.g. 10). In Step S730, the processing unit 120 may determine whether a similarity degree between the first difference value (−5.012674) and the second difference value (−85.663) is greater than or equal to the predetermined similarity degree (e.g. 80%). At this time, since the similarity degree between the first difference value (−5.012674) and the second difference value (−85.663) is not greater than or equal to the predetermined similarity degree, therefore, the processing unit 120 subsequently executes Step S740. Since the absolute value (5.012674) of the first difference value is less than the absolute value (85.663) of the second difference value, therefore, the processing unit 120 executes Step S760, so as to use the first difference value (−5.012674) to replace the second difference value (−85.663). That is, the replaced second difference value is −5.012674.

Using a time point T85 as an example, a first difference value (−0.752068) and a second difference value (−422.844) corresponding to the time point T85 may be calculated by reference to the earlier disclosure, and therefore further elaboration thereof is omitted hereafter. At the time point T85, the processing unit 120 subsequently executes Step S730 because the absolute value of the second difference value (−422.844) is greater than the lower boundary value (e.g. 10). In Step S730, the processing unit 120 may determine whether a similarity degree between the first difference value (−0.752068) and the second difference value (−422.844) is greater than or equal to the predetermined similarity degree (e.g. 80%). At this time, since the similarity degree between the first difference value (−0.752068) and the second difference value (−422.844) is not greater than or equal to the predetermined similarity degree, therefore, the processing unit 120 subsequently executes Step S740. Since the absolute value (0.752068) of the first difference value is less than the absolute value (422.844) of the second difference value, therefore, the processing unit 120 executes Step S760, so as to use the first difference value (−0.752068) to replace the second difference value (−422.844). That is, the replaced second difference value is −0.752068 (the first difference value and the second difference value may round up to −0.752067 on the table of FIG. 8).

Figure 9:
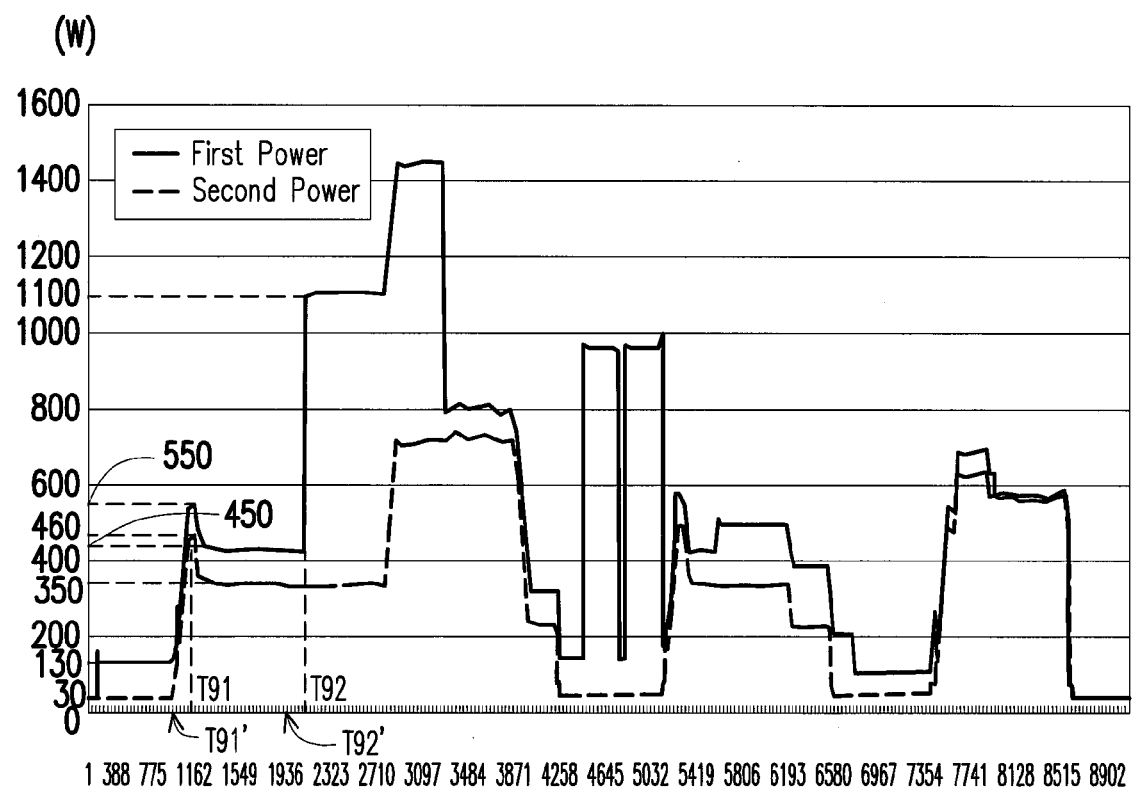
FIG. 9 depicts schematic views of a first power and a second power according to an exemplary embodiment.

FIG. 9 depicts schematic views of a first power and a second power according to an exemplary embodiment. The spirit of the present embodiment is described below with reference to FIGS. 1, 7 and 9.

Using a time point T91 as an example, assuming that a time point T91' is a previous collection time point of the time point T91, then a first difference value and a second difference value corresponding to the time point T91 are approximately 420 (550−130) and 430 (460−30), respectively. Therefore, when the lower boundary value is 10, the processing unit 120 may execute Steps S730, S715, and S720 after Step S710.

Using a time point T92 as an example, assuming that a time point T92' is a previous collection time point of the time point T92, then a first difference value and a second difference value corresponding to the time point T92 are approximately 650 (1100−450) and 0 (350−350), respectively. Therefore, when the lower boundary value is 10, the processing unit 120 may execute Steps S730, S740, S750, and S720 after Step S710.

Moreover, although embodiments of the disclosure have used 110V for the first phase power and −110V for the second phase power as a basis to facilitate description, but when the first phase power and the second phase power are implemented by other numerical volt values, the disclosure may also correspondingly achieve the effect of identifying the unknown electric appliance.

Using the Japanese power system as an example, a first phase power may be 100V, and a second phase power may be −100V. Therefore, a first type electric appliance corresponding to the Japanese power system may be an electric appliance suitable for using a 100V input power source, and a second type electric appliance may be an electric appliance suitable for using a 200V input power source. Moreover, using the American power system as an example, a first phase power may be 120V, and a second phase power may be −120V. Therefore, a first type electric appliance corresponding to the American power system may be an electric appliance suitable for using a 120V input power source, and a second type electric appliance may be an electric appliance suitable for using a 240V power source. In other words, by adopting the spirit of the disclosure, different unknown electric appliances under the frameworks of the Japanese and American power systems can be identified.

Figure 10:
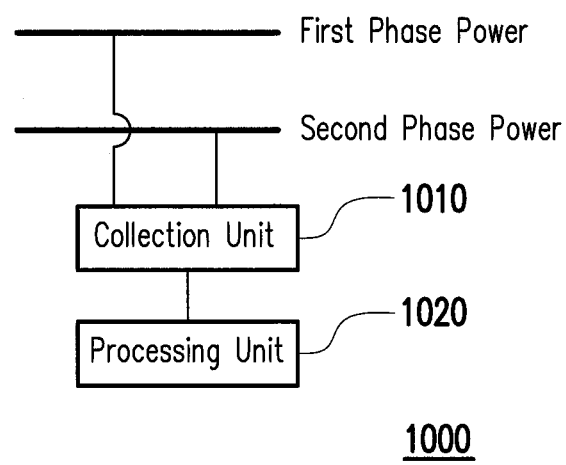
FIG. 10 is a schematic view of a system for identifying an electric appliance according to an exemplary embodiment.

In other embodiments, the components in the apparatus for identifying the electric appliance 100 may be respectively implemented in a plurality of disperse electric appliances, as shown in FIG. 10. FIG. 10 is a schematic view of a system for identifying an electric appliance according to an exemplary embodiment. In the present embodiment, a system for identifying an electric appliance 1000 includes a collection unit 1010 and a processing unit 1020. The collection unit 1010 and the processing unit 1020 may be two independent electric devices, and the interaction between the two devices may be the same as between the collection unit 110 and the processing unit 120, and thus further elaboration thereof is omitted hereafter.

In view of the foregoing, when the first power event and/or the second power event is collected, the apparatuses and methods for identifying the electric appliance provided by the embodiments in the disclosure may determine whether the unknown electric appliance causing the first power event and/or the second power event belongs to the first type electric appliance or the second device by observing the point of time when the first power event and the second power event occur, and also by observing whether the first power event and the second power event are the same. By adopting the methods in the disclosure, the accuracy of identifying the first type electric appliance and the second type electric appliance can be effectively increased.

Moreover, after identifying the unknown electric appliance as the first type electric appliance, the disclosure may further analyze the first electrical characteristic and the second electrical characteristic, so as to identify the true identity of the unknown electric appliance. Alternatively, after identifying the unknown electric appliance as the first type electric appliance, the disclosure may further calculate the total power consumed according to the first difference value and the second difference value. Therefore, while identifying the unknown electric appliance, the apparatuses for identifying the electric appliance in the present embodiment can precisely grasp the operational state of each electric appliance (e.g., the respective power consumed by each electric appliance), and thereby provide the user the complete power monitoring information.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An apparatus for identifying an electric appliance connected to a multi-wire single-phase power, comprising:
    a collection unit respectively collecting a first power event on a first phase power by the multi-wire single-phase power and a second power event on a second phase power by the multi-wire single-phase power; and
    a processing unit coupled to the collection unit, the processing unit identifying whether an unknown electric appliance is a first type electric appliance or a second type electric appliance:
        wherein when the collection unit collects at least one of the first power event and the second power event, the processing unit determines whether the first power event and the second power event occur at the same time, wherein at least one of the first power event and the second power event corresponds to the unknown electric appliance;
        if the processing unit determines that the first power event and the second power event do not occur at the same time, the unknown electric appliance is identified as the first type electric appliance;
        if the processing unit determines that the first power event and the second power event do occur at the same time, whether the first power event and the second power event are the same is determined;
            if the first power event and the second power event are the same, the unknown electric appliance is identified as the second type electric appliance;
            if the first power event and the second power event are not the same, the unknown electric appliance is identified as the first type electric appliance.

2. The apparatus of claim 1, wherein the first type electric appliance is suitable for using a 100-120V power source, and the second type electric appliance is suitable for using a 200-240V power source.

3. The apparatus of claim 1, wherein the apparatus further comprises a storage unit storing a plurality of power signatures corresponding to a plurality of electric appliances.

4. The apparatus of claim 3, wherein after identifying the unknown electric appliance as the first type electric appliance, the processing unit is further configured for:
    identifying an identity of the unknown electric appliance according to a difference value between a first electrical characteristic of the first phase power and a second electrical characteristic of the second phase power and the power signatures.

5. The apparatus of claim 1, wherein the collection unit actively detects the first power event and the second power event or passively receives the first power event and the second power event.

6. An apparatus for identifying an electric appliance connected to a multi-wire single-phase power, comprising:
    a collection unit respectively collecting a first power event on a first phase power by the multi-wire single-phase power and a second power event on a second phase power by the multi-wire single-phase power;
    a storage unit storing a plurality of power signatures corresponding to a plurality of electric appliances; and
    a processing unit coupled to the collection unit, the processing unit identifying whether an unknown electric appliance is a first type electric appliance or a second type electric appliance:
        wherein when the collection unit collects at least one of the first power event and the second power event, the processing unit determines whether the first power event and the second power event occur at the same time, wherein at least one of the first power event and the second power event corresponds to the unknown electric appliance;
        if the processing unit determines that the first power event and the second power event do not occur at the same time, the unknown electric appliance is identified as the first type electric appliance;
        if the processing unit determines that the first power event and the second power event do occur at the same time, whether the first power event and the second power event are the same is determined;
            if the first power event and the second power event are the same, the unknown electric appliance is identified as the second type electric appliance;

if the first power event and the second power event are not the same, the unknown electric appliance is identified as the first type electric appliance, the processing unit is further configured for:

identifying an identity of the unknown electric appliance according to a difference value between a first electrical characteristic of the first phase power and a second electrical characteristic of the second phase power and the power signatures;

subtracting the second electrical characteristic from the first electrical characteristic to generate the difference value;

subtracting a difference value of a previous collection time point from the generated difference value, so as to obtain a specific power signature of the unknown electric appliance;

determining whether the first power event has occurred on the first phase power;

if the first power event has occurred on the first phase power, comparing the specific power signature and the plurality of power signatures, so as to find a target electric appliance among the plurality of electric appliances matching the specific power signature;

if the first power event has not occurred on the first phase power, inverting a phase of the specific power signature, and comparing the phase-inverted specific power signature and the plurality of power signatures, so as to find the target electric appliance among the plurality of electric appliances matching the phase-inverted specific power signature; and identifying the identity of the unknown electric appliance as the target electric appliance.

7. An apparatus for identifying an electric appliance connected to a multi-wire single-phase power, comprising:

a collection unit respectively collecting a first power event on a first phase power by the multi-wire single-phase power and a second power event on a second phase power by the multi-wire single-phase power;

a storage unit storing a plurality of power signatures corresponding to a plurality of electric appliances; and a processing unit coupled to the collection unit, the processing unit identifying whether an unknown electric appliance is a first type electric appliance or a second type electric appliance:

wherein when the collection unit collects at least one of the first power event and the second power event, the processing unit determines whether the first power event and the second power event occur at the same time, wherein at least one of the first power event and the second power event corresponds to the unknown electric appliance;

if the processing unit determines that the first power event and the second power event do not occur at the same time, the unknown electric appliance is identified as the first type electric appliance;

if the processing unit determines that the first power event and the second power event do occur at the same time, whether the first power event and the second power event are the same is determined;

if the first power event and the second power event are the same, the unknown electric appliance is identified as the second type electric appliance;

if the first power event and the second power event are not the same, the unknown electric appliance is identified as the first type electric appliance, the processing unit is further configured for:

calculating a total power consumed corresponding to a first time point by the second type electric appliance according to a first difference value and a second difference value, wherein the first time point is a time point when at least one of the first power event and the second power event is collected, wherein the first difference value is a difference value between a first power of the first phase power at the first time point and the first power of the first phase power at a second time point, wherein the second time point is a collection time point before the first time point, wherein the second difference value is a difference value between a second power of the second phase power at the first time point and the second power of the second phase power at the second time point.

8. The apparatus of claim 7, wherein the processing unit is configured for:

determining whether the first difference value and the second difference value are both less than a lower boundary value; and if the first difference value and the second difference value are both less than the lower boundary value, maintaining the first difference value and the second difference value, and adding the first difference value and the first power to the total power consumed corresponding to the second time point, so as to calculate the total power consumed corresponding to the first time point.

9. The apparatus of claim 8, wherein when the first difference value and the second difference value are both not less than the lower boundary value, the processing unit is further configured for:

determining whether a similarity degree between the first difference value and the second difference value is greater than or equal to a predetermined similarity degree; and if the similarity degree between the first difference value and the second difference value is greater than or equal to the predetermined similarity degree, maintaining the first difference value and the second difference value, and adding the first difference value and the first power to the total power consumed corresponding to the second time point, so as to calculate the total power consumed corresponding to the first time point.

10. The apparatus of claim 9, wherein when the similarity degree between the first difference value and the second difference value are both not greater than or equal to the predetermined similarity degree, the processing unit is further configured for:

determining whether an absolute value of the first difference value is less than an absolute value of the second difference value;

if the absolute value of the first difference value is less than the absolute value of the second difference value, replacing the second difference value with the first difference value;

if the absolute value of the first difference value is not less than the absolute value of the second difference value, replacing the first difference value with the second difference value; and adding the first difference value and the first power to the total power consumed corresponding to the second time point, so as to calculate the total power consumed corresponding to the first time point.

11. A method for identifying an electric appliance, adapted for an apparatus for identifying the electric appliance connected to a multi-wire single-phase power, the method comprising:
respectively collecting a first power event on a first phase power by the multi-wire single-phase power and a second power event on a second phase power by the multi-wire single-phase power;
when at least one of the first power event and the second power event is collected, determining whether the first power event and the second power event occur at the same time, wherein at least one of the first power event and the second power event corresponds to an unknown electric appliance;
if the processing unit determines that the first power event and the second power event do not occur at the same time, identifying the unknown electric appliance as a first type electric appliance;
if the processing unit determines that the first power event and the second power event do occur at the same time, determining whether the first power event and the second power event are the same;
if the first power event and the second power event are the same, identifying the unknown electric appliance as a second type electric appliance; and
if the first power event and the second power event are not the same, identifying the unknown electric appliance as the first type electric appliance.

12. The method of claim 11, wherein the first type electric appliance is suitable for using a 100120V power source, and the second type electric appliance is suitable for using a 200240V power source.

13. The method of claim 11, further comprising storing a plurality of power signatures corresponding to a plurality of electric appliances.

14. The method of claim 13, wherein after the step of identifying the unknown electric appliance as the first type electric appliance, the method further comprises:
identifying an identity of the unknown electric appliance according to a difference value between a first electrical characteristic of the first phase power and a second electrical characteristic of the second phase power and the power signatures.

15. The method of claim 11, wherein the step of respectively collecting the first power event on the first phase power and the second power event on the second phase power comprises:
actively detecting the first power event and the second power event or passively receiving the first power event and the second power event.

16. A method for identifying an electric appliance, adapted for an apparatus for identifying the electric appliance connected to a multi-wire single-phase power, the method comprising:
respectively collecting a first power event on a first phase power by the multi-wire single-phase power and a second power event on a second phase power by the multi-wire single-phase power;
storing a plurality of power signatures corresponding to a plurality of electric appliances;
when at least one of the first power event and the second power event is collected, determining whether the first power event and the second power event occur at the same time, wherein at least one of the first power event and the second power event corresponds to an unknown electric appliance;
if the processing unit determines that the first power event and the second power event do not occur at the same time, identifying the unknown electric appliance as a first type electric appliance;
if the processing unit determines that the first power event and the second power event do occur at the same time, determining whether the first power event and the second power event are the same;
if the first power event and the second power event are the same, identifying the unknown electric appliance as a second type electric appliance; and
if the first power event and the second power event are not the same, identifying the unknown electric appliance as the first type electric appliance;
identifying an identity of the unknown electric appliance according to a difference value between a first electrical characteristic of the first phase power and a second electrical characteristic of the second phase power and the power signatures, the step comprises:
subtracting the second electrical characteristic from the first electrical characteristic to generate the difference value;
subtracting a difference value of a previous collection time point from the generated difference value, so as to obtain a specific power signature of the unknown electric appliance;
determining whether the first power event has occurred on the first phase power;
if the first power event has occurred on the first phase power, comparing the specific power signature and the plurality of power signatures, so as to find a target electric appliance among the plurality of electric appliances matching the specific power signature;
if the first power event has not occurred on the first phase power, inverting a phase of the specific power signature, and comparing the phase-inverted specific power signature and the plurality of power signatures, so as to find the target electric appliance among the plurality of electric appliances matching the phase-inverted specific power signature; and
identifying the identity of the unknown electric appliance as the target electric appliance.

17. A method for identifying an electric appliance, adapted for an apparatus for identifying the electric appliance connected to a multi-wire single-phase power, the method comprising:
respectively collecting a first power event on a first phase power by the multi-wire single-phase power and a second power event on a second phase power by the multi-wire single-phase power;
when at least one of the first power event and the second power event is collected, determining whether the first power event and the second power event occur at the same time, wherein at least one of the first power event and the second power event corresponds to an unknown electric appliance;
if the processing unit determines that the first power event and the second power event do not occur at the same time, identifying the unknown electric appliance as a first type electric appliance;
if the processing unit determines that the first power event and the second power event do occur at the same time, determining whether the first power event and the second power event are the same;

if the first power event and the second power event are the same, identifying the unknown electric appliance as a second type electric appliance; and if the first power event and the second power event are not the same, identifying the unknown electric appliance as the first type electric appliance; and calculating a total power consumed corresponding to a first time point by the second type electric appliance according to a first difference value and a second difference value, wherein the first time point is a time point when at least one of the first power event and the second power event is collected, wherein the first difference value is a difference value between a first power of the first phase power at the first time point and the first power of the first phase power at a second time point, wherein the second time point is a collection time point before the first time point, wherein the second difference value is a difference value between a second power of the second phase power at the first time point and the second power of the second phase power at the second time point.

18. The method of claim 17, wherein the step of calculating the total power consumed corresponding to the first time point by the second type electric appliance according to the first difference value and the second difference value comprises:

determining whether the first difference value and the second difference value are both less than a lower boundary value; and if the first difference value and the second difference value are both less than the lower boundary value, maintaining the first difference value and the second difference value, and adding the first difference value and the first power to the total power consumed corresponding to the second time point, so as to calculate the total power consumed corresponding to the first time point.

19. The method of claim 18, wherein when the first difference value and the second difference value are both not less than the lower boundary value, the method further comprises:

determining whether a similarity degree between the first difference value and the second difference value is greater than or equal to a predetermined similarity degree; and if the similarity degree between the first difference value and the second difference value is greater than or equal to the predetermined similarity degree, maintaining the first difference value and the second difference value, and adding the first difference value and the first power to the total power consumed corresponding to the second time point, so as to calculate the total power consumed corresponding to the first time point.

20. The method of claim 19, wherein when the similarity degree between the first difference value and the second difference value are both not greater than or equal to the predetermined similarity degree, the method further comprises:

determining whether an absolute value of the first difference value is less than an absolute value of the second difference value;

if the absolute value of the first difference value is less than the absolute value of the second difference value, replacing the second difference value with the first difference value;

if the absolute value of the first difference value is not less than the absolute value of the second difference value, replacing the first difference value with the second difference value; and adding the first difference value and the first power to the total power consumed corresponding to the second time point, so as to calculate the total power consumed corresponding to the first time point.

21. A system for identifying an electric appliance connected to a multi-wire single-phase power, comprising:

a collection unit respectively collecting a first power event on a first phase power by the multi-wire single-phase power and a second power event on a second phase power by the multi-wire single-phase power; and a processing unit coupled to the collection unit, the processing unit identifying whether an unknown electric appliance is a first type electric appliance or a second type electric appliance:

wherein when the collection unit collects at least one of the first power event and the second power event, the processing unit determines whether the first power event and the second power event occur at the same time, wherein at least one of the first power event and the second power event corresponds to the unknown electric appliance;

if the processing unit determines that the first power event and the second power event do not occur at the same time, the unknown electric appliance is identified as the first type electric appliance;

if the processing unit determines that the first power event and the second power event do occur at the same time, determining whether the first power event and the second power event are the same;

if the first power event and the second power event are the same, the unknown electric appliance is identified as the second type electric appliance;

if the first power event and the second power event are not the same, the unknown electric appliance is identified as the first type electric appliance, wherein the collection unit and the processing unit are two independent electronic devices.

* * * * *